(12) United States Patent
Liang et al.

(10) Patent No.: US 8,779,514 B2
(45) Date of Patent: Jul. 15, 2014

(54) TRANSISTOR AND METHOD FOR MANUFACTURING THE SAME

(75) Inventors: Qingqing Liang, Beijing (CN); Huicai Zhong, Beijing (CN); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 242 days.

(21) Appl. No.: 13/144,903

(22) PCT Filed: Feb. 25, 2011

(86) PCT No.: PCT/CN2011/000307
§ 371 (c)(1),
(2), (4) Date: Jul. 15, 2011

(87) PCT Pub. No.: WO2012/088730
PCT Pub. Date: Jul. 5, 2012

(65) Prior Publication Data
US 2012/0168865 A1    Jul. 5, 2012

(30) Foreign Application Priority Data
Dec. 29, 2010 (CN) .......................... 2010 1 0622874

(51) Int. Cl.
*H01L 29/772* (2006.01)
*H01L 21/336* (2006.01)

(52) U.S. Cl.
USPC ................... 257/348; 257/347; 257/E29.242; 257/E21.409; 257/387; 438/151; 438/154; 438/300

(58) Field of Classification Search
CPC .............. H01L 29/66545; H01L 29/78; H01L 29/41783
USPC .......... 257/348, 347, E29.242, E21.409, 387, 257/288, 384; 438/151, 154, 300, 586
See application file for complete search history.

(56) References Cited

U.S. PATENT DOCUMENTS

| | | | |
|---|---|---|---|
| 7,411,252 B2 | 8/2008 | Anderson et al. | 257/365 |
| 7,943,467 B2 | 5/2011 | Zhu et al. | 438/283 |
| 2006/0286724 A1 | 12/2006 | Anderson et al. | 438/149 |
| 2009/0072314 A1 | 3/2009 | Okumura et al. | 257/355 |
| 2009/0184378 A1 | 7/2009 | Zhu et al. | 257/387 |
| 2010/0047984 A1* | 2/2010 | Cohen et al. | 438/283 |
| 2012/0032270 A1* | 2/2012 | Okumura et al. | 257/368 |
| 2012/0280211 A1* | 11/2012 | Cohen et al. | 257/24 |

FOREIGN PATENT DOCUMENTS

| | | | | |
|---|---|---|---|---|
| CN | 1885562 A | 12/2006 | | H01L 29/78 |
| CN | 101221985 A | 7/2008 | | H01L 21/28 |
| CN | 101488453 A | 7/2009 | | H01L 21/28 |
| JP | 2002009281 A | 1/2002 | | H01L 21/822 |

* cited by examiner

*Primary Examiner* — Cathy N Lam
(74) *Attorney, Agent, or Firm* — Martine Penilla Group, LLP

(57) ABSTRACT

The invention relates to a transistor and a method for manufacturing the transistor. The transistor according to an embodiment of the invention may comprise: a substrate which comprises at least a back gate of the transistor, an insulating layer and a semiconductor layer stacked sequentially, wherein the back gate of the transistor is used for adjusting the threshold voltage of the transistor; a gate stack formed on the semiconductor layer, wherein the gate stack comprises a gate dielectric and a gate electrode formed on the gate dielectric; a spacer formed on sidewalls of the gate stack; and a source region and a drain region located on both sides of the gate stack, respectively, wherein the height of the gate stack is lower than the height of the spacer. The transistor enables the height of the gate stack to be reduced and therefore the performance of the transistor is improved.

4 Claims, 9 Drawing Sheets

TRANSISTOR AND METHOD FOR MANUFACTURING THE SAME

CROSS REFERENCE

This application is a Section 371 National Stage Application of International Application No. PCT/CN2011/000307, filed on Feb. 25, 2011, which claims priority to CN 201010622874.2, filed on Dec. 29, 2010, the entire contents of which are incorporated herein by reference in their entirety.

FIELD OF THE INVENTION

The invention relates to a transistor. In addition, the invention also relates to a method for manufacturing the transistor.

BACKGROUND OF THE INVENTION

The transistor is a commonly used element in integrated circuits. However, with the development of semiconductor process towards deep sub-micrometer scale or even nanometer scale, some new problems occurs. For example, the effect of parasitic capacitance on the performance of the transistor becomes more serious. In particular, the parasitic capacitance between a gate stack and an electric contact due to the height of the gate stack has become a huge obstacle for improving the performance of a nanometer scale transistor. In addition, due to a smaller gate-gate pitch, the height of the gate stack further brings about limitations to a plurality of process modules for manufacturing a semiconductor device.

Therefore, for improving the performance of the transistor, it is desirable to reduce the height of the gate stack. However, in the existing transistor, the adjustment of the threshold voltage of the transistor mainly depends on the work function of the gate stack, whereas the work function is affected by the material and height of the gate stack. Furthermore, in the process flow for manufacturing a transistor, the gate stack needs to have a certain height under some circumstances sequentially to function as a barrier layer. These factors all limit the reduction of the height of the gate stack.

SUMMARY OF THE INVENTION

An object of the invention is to overcome at least some of the above drawbacks and provide an improved transistor and method for manufacturing the same.

According to an aspect of the invention, there is provided a transistor comprising: a substrate which comprises at least a back gate of the transistor, an insulating layer and a semiconductor layer stacked sequentially, wherein the back gate of the transistor is used for adjusting the threshold voltage of the transistor; a gate stack formed on the semiconductor layer, wherein the gate stack comprises a gate dielectric and a gate electrode formed on the gate dielectric; a spacer formed on sidewalls of the gate stack; and a source region and a drain region located on both sides of the gate stack, respectively, wherein the height of the gate stack is lower than the height of the spacer.

The inventors have realized that the threshold voltage of the transistor may be adjusted by the back gate, thereby reducing or eliminating the limitations to the material and height, etc. of the gate stack of the transistor due to adjustment of the threshold voltage.

In view of the realization, according to an embodiment of the present invention, the transistor comprises a back gate and the back gate is used for adjusting the threshold voltage of the transistor, and the height of the gate stack of the transistor is lower than the height of the spacer. Such a gate stack with a reduced height can reduce the parasitic capacitance and thus improve the performance of the transistor.

According to another aspect of the invention, there is provided a transistor comprising: a substrate which comprises at least a back gate of the transistor, an insulating layer and a semiconductor layer stacked sequentially, wherein the back gate of the transistor is used for adjusting the threshold voltage of the transistor; a gate stack formed on the semiconductor layer, wherein the gate stack comprises a gate dielectric and a gate electrode formed on the gate dielectric; a spacer formed on sidewalls of the gate stack; a source region and a drain region located on both sides of the gate stack, respectively; and a back gate contact formed on a portion of the back gate, wherein the back gate contact comprises a part raised from the surface of the back gate, each of the source region and the drain region comprises a part raised from the surface of the semiconductor layer, and the height of the gate stack is lower than the height of the spacer.

The proposed transistor comprises a back gate contact formed on a portion of the back gate and the back gate contact comprises a part raised (by epitaxy) from the surface of the back gate. The formation of a back gate contact can implement a desired electric connection between the back gate of the transistor and other components in the circuit. In addition, the formation of the back gate contact of the transistor will not damage the formed structures, and no additional protective layer is needed, thereby simplifying the manufacturing process and reducing the cost of manufacture.

According to yet another aspect of the invention, a method for manufacturing a transistor is provided. The method comprises: providing a substrate, the substrate comprising at least a back gate of the transistor, an insulating layer and a semiconductor layer stacked sequentially, wherein the back gate of the transistor is used for adjusting the threshold voltage of the transistor; forming a gate stack on the semiconductor layer, wherein the gate stack comprises a gate dielectric, a gate electrode formed on the gate dielectric and a sacrificial layer formed on the gate electrode; forming a spacer on sidewalls of the gate stack; forming a source region and a drain region on both sides of the gate stack, respectively; and selectively removing the sacrificial layer of the gate stack.

According to still another aspect of the invention, a method for manufacturing a transistor is provided. The method comprises: providing a substrate, the substrate comprising at least a back gate of the transistor, an insulating layer and a semiconductor layer stacked sequentially, wherein the back gate of the transistor is used for adjusting the threshold voltage of the transistor; forming a gate stack on the semiconductor layer, wherein the gate stack comprises a gate dielectric, a gate electrode formed on the gate dielectric and a sacrificial layer formed on the gate electrode; selectively removing a portion of the semiconductor layer and a portion of the insulating layer to expose a portion of the back gate; forming a spacer on sidewalls of the gate stack; forming a source region and a drain region on both sides of the gate stack, respectively; performing selective growth to the exposed portion of the back gate, the source region and the drain region to form a part raised from the surface of the back gate and thus form a back gate contact, so that each of the source region and the drain region comprises a part raised from the surface of the semiconductor layer; and selectively removing the sacrificial layer of the gate stack.

BRIEF DESCRIPTION OF THE DRAWINGS

These and other objects, features and advantages of the invention will become more apparent from the following detailed description of the exemplary embodiments of the invention with reference to the accompanying drawings. In the drawings.

DETAILED DESCRIPTION OF THE INVENTION

Figure 1A:
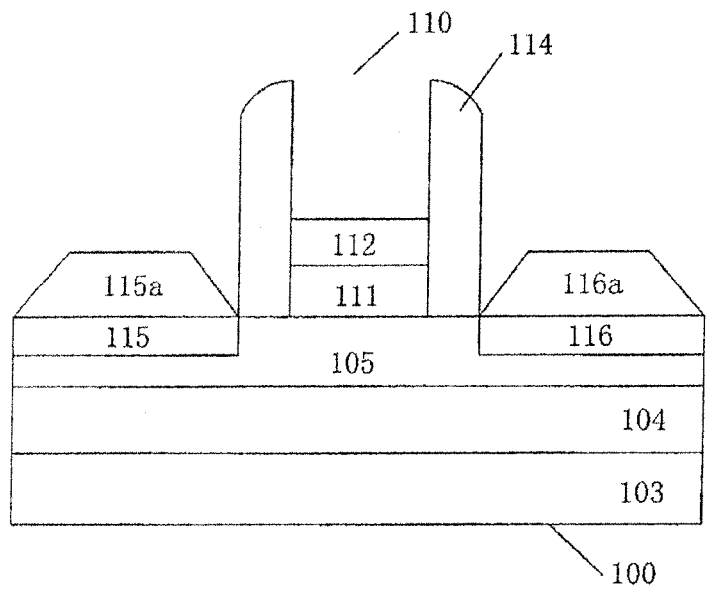
FIG. 1A shows a schematic cross section view of a transistor according to an exemplary embodiment of the invention.

The exemplary embodiments of the invention will be described in detail with reference to the accompanying drawings hereinafter. The drawings are schematic and not drawn to scale just for illustrating the embodiments of the invention, and are not intended to limit the protective scope of the invention. In the drawings, like reference numerals denote identical or similar components. For making the technical solution of the invention clearer, process steps and structures of a device known in the art are omitted herein.

Firstly, a transistor according to an exemplary embodiment of the invention is described in detail with reference to FIGS. 1A and 1B.

FIG. 1A shows a schematic cross section view of a transistor according to an exemplary embodiment of the invention.

As shown in FIG. 1A, a substrate 100 for forming a transistor 110 may comprise a back gate 103, an insulating layer 104 and a semiconductor layer 105 stacked sequentially. As an example, the insulating layer 104 of the substrate 100 may comprise, but not limited to, a material selected from a group consisting of $SiO_2$, $Si_3N_4$, and a combination thereof. The semiconductor layer 105 may comprise, but not limited to, a material selected from a group consisting of Si, SiGe, SiC, Ge, GaAs, InP, and combinations thereof.

The back gate 103 may comprise, for example, a semiconductor material. For example, the back gate 103 may comprise, but not limited to, a material selected from a group consisting of Si, SiGe, SiC, Ge, GaAs, InP, and combinations thereof. The back gate 103 may also comprise metals. For example, the back gate 103 may comprise, but not limited to, a material selected from a group consisting of Cu, Al, TiN, and combinations thereof. In the transistor 110, the back gate 103 is used for adjusting the threshold voltage of the transistor. For example, the body region of the transistor may be controlled by the back gate, so that biasing of the back gate may affect the Fermi level of the whole body region to cause inversion or accumulation of the body region, thereby adjusting the threshold voltage of the transistor.

It should be noted that the number of the semiconductor layer and the number of the insulating layer comprised in the substrate 100 are not limited to those shown in FIG. 1A. The substrate may comprise, for example, more semiconductor layers or insulating layers.

A gate stack of the transistor 110 is formed on the semiconductor layer 105 of the substrate 100. The gate stack may comprise a gate dielectric 111 and a gate electrode 112 formed on the gate dielectric. The gate dielectric may, for example, comprise a material selected from a group consisting of $SiO_2$, $Si_3N_4$, $HfO_2$, and combinations thereof. The gate electrode may, for example, comprise a material selected from a group consisting of Ti, Al, Cu, graphene, and combinations thereof. A spacer 114 is formed on sidewalls of the gate stack. The spacer 114 may, for example, comprise a nitride, such as $Si_3N_4$. The spacer 114 may also comprise an oxide, such as $SiO_2$.

A source region 115 and a drain region 116 of the transistor 110 are located on both sides of the gate stack, respectively. Optionally but not necessarily, the source region 115 and the drain region 116 may comprise parts 115a and 116a raised from the surface of the semiconductor layer 105, respectively. The source region and the drain region of the transistor are raised. This is particularly advantageous if it is desired to form a contact hole, since the raised parts may reduce the etching height required for forming the contact hole.

In the transistor shown in FIG. 1A, the height of the gate stack comprising the gate dielectric 111 and the gate electrode 112 is lower than the height of the spacer 114. For example, the height of the gate stack may be within the range of about 0.5 nm to 30 nm.

In the transistor shown in FIG. 1A, the back gate is used for adjusting the threshold voltage of the transistor, and the height of the gate stack of the transistor is lower than the height of the spacer. Such a gate stack with a reduced height can reduce the parasitic capacitance and thus improve the performance of the transistor.

Figure 1B:
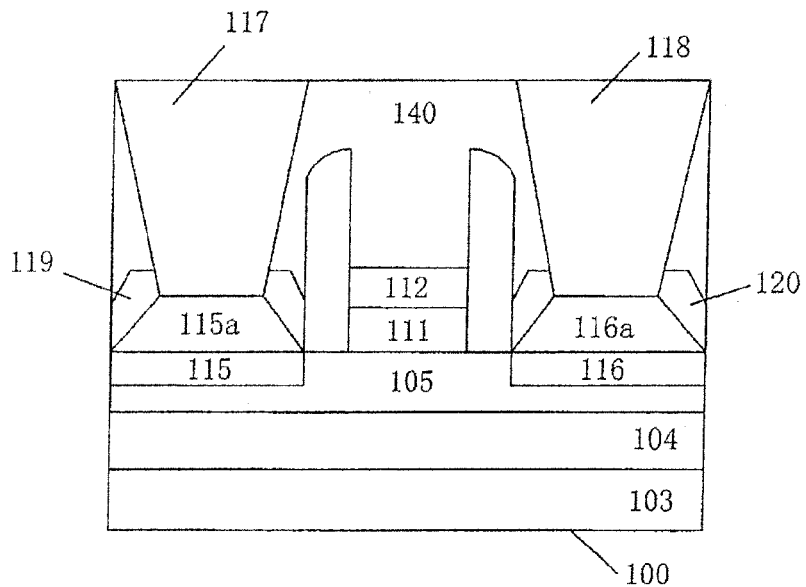
FIG. 1B shows a schematic view of the transistor in FIG. 1A after forming a contact.

FIG. 1B shows a schematic view of the transistor in FIG. 1A after forming a contact. The structure of the transistor shown in FIG. 1B is substantially the same as the transistor in FIG. 1A except for the contact plug.

As shown in FIG. 1B, in the case where the source region 115 and the drain region 116 of the transistor comprise the parts 115a and 116a raised from the surface of the semiconductor layer 105, respectively, a source region contact plug 117 and a drain region contact plug 118 may be formed on the raised part 115a of the source region and the raised part 116a of the drain region of the transistor, respectively. In the exemplary embodiment shown in FIG. 1B, the source region contact plug 117 and the drain region contact plug 118 may be formed in a passivation layer 140 above the source region and the drain region respectively.

Optionally, the raised part 115a of the source region and the raised part 116a of the drain region may comprise a metal silicide, respectively. Optionally, liners 119 and 120 may be formed on the outer surface of the raised part 115a of the source region and the outer surface of the raised part 116a of the drain region, respectively. The liners 119 and 120 may, for example, comprise a nitride.

In the following, a transistor according to another exemplary embodiment of the invention is described in detail with reference to FIGS. 2A and 2B.

Figure 2A:
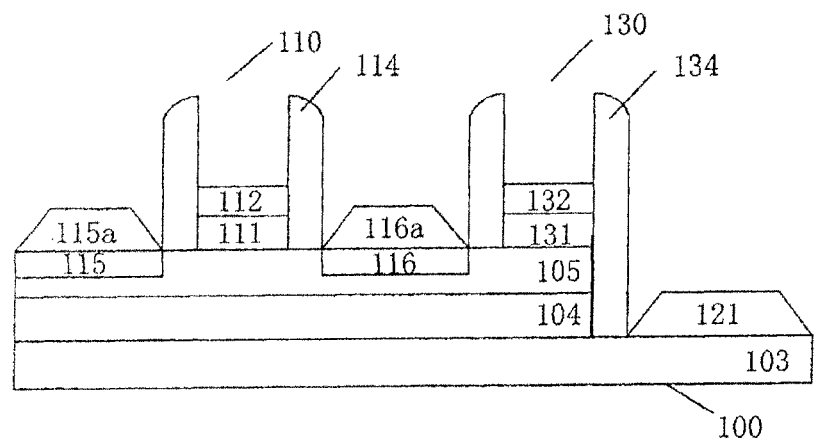
FIG. 2A shows a schematic cross section view of a transistor according to another exemplary embodiment of the invention.

FIG. 2A shows a schematic cross section view of a transistor according to another exemplary embodiment of the invention.

As shown in FIG. 2A, a substrate 100 for forming a transistor 110 may comprise a back gate 103, an insulating layer 104 and a semiconductor layer 105 stacked sequentially. As an example, the insulating layer 104 of the substrate 100 may comprise, but not limited to, a material selected from a group consisting of $SiO_2$, $Si_3N_4$, and a combination thereof. The semiconductor layer 105 may comprise, but not limited to, a material selected from a group consisting of Si, SiGe, SiC, Ge, GaAs, InP, and combinations thereof.

The back gate 103 may comprise, for example, a semiconductor material. For example, the back gate 103 may comprise, but not limited to, a material selected from a group consisting of Si, SiGe, SiC, Ge, GaAs, InP, and combinations thereof. The back gate 103 may also comprise metals. For example, the back gate 103 may comprise, but not limited to, a material selected from a group consisting of Cu, Al, TiN, and combinations thereof. In the transistor 110, the back gate 103 is used for adjusting the threshold voltage of the transistor. For example, the body region of the transistor may be controlled by the back gate, so that biasing of the back gate may affect the Fermi level of the whole body region to cause inversion or accumulation of the body region, thereby adjusting the threshold voltage of the transistor.

It should be noted that the number of the semiconductor layer and the number of the insulating layer comprised in the substrate 100 are not limited to those shown in FIG. 2A. The substrate may comprise, for example, more semiconductor layers or insulating layers.

A gate stack of the transistor 110 is formed on the semiconductor layer 105 of the substrate 100. The gate stack may comprise a gate dielectric 111 and a gate electrode 112 formed on the gate dielectric. The gate dielectric may, for example, comprise a material selected from a group consisting of $SiO_2$, $Si_3N_4$, $HfO_2$, and combinations thereof. The gate electrode may, for example, comprise a material selected from a group consisting of Ti, Al, Cu, graphene, and combinations thereof. A spacer 114 is formed on sidewalls of the gate stack. The spacer 114 may, for example, comprise a nitride, such as $Si_3N_4$. The spacer 114 may also comprise an oxide, such as $SiO_2$.

A source region 115 and a drain region 116 of the transistor 110 are located on both sides of the gate stack, respectively. The source region 115 and the drain region 116 may comprise parts 115a and 116a raised from the surface of the semiconductor layer 105, respectively. The source region and the drain region of the transistor are raised. This is particularly advantageous if it is desired to form a contact hole, since the raised parts may reduce the etching height required for forming the contact hole.

The transistor 110 further comprises a back gate contact 121. The back gate contact 121 is formed on a portion of the back gate 103. In the exemplary embodiment shown in FIG. 2A, the back gate contact 121 comprises a part raised from the surface of the back gate 103.

Optionally, a dummy gate 130 may further be formed on the substrate 100. The dummy gate 130 is used for isolating the back gate contact 121 from the source region and the drain region of the transistor. The dummy gate 130 may comprise a dummy gate stack. In an example, the dummy gate stack may comprise a dummy gate dielectric 131 and a dummy gate electrode 132 formed on the dummy gate dielectric. The dummy gate dielectric may, for example, comprise a material selected from a group consisting of $SiO_2$, $Si_3N_4$, $HfO_2$, and combinations thereof. The dummy gate electrode may, for example, comprise a material selected from a group consisting of Ti, Al, Cu, graphene, and combinations thereof. Optionally, a spacer 134 may be formed on sidewalls of the dummy gate stack. The spacer 134 may, for example, comprise a nitride, such as $Si_3N_4$. The spacer 134 may also comprise an oxide, such as $SiO_2$.

In the transistor shown in FIG. 2A, the height of the gate stack comprising the gate dielectric 111 and the gate electrode 112 is lower than the height of the spacer 114. For example, the height of the gate stack may be within the range of about 0.5 nm to 30 nm.

In the transistor shown in FIG. 2A, the back gate is used for adjusting the threshold voltage of the transistor, and the height of the gate stack of the transistor is lower than the height of the spacer. Such a gate stack with a reduced height can reduce the parasitic capacitance and thus improve the performance of the transistor. Moreover, the formation of a back gate contact can implement a desired electric connection between the back gate of the transistor and other components in the circuit. In addition, the back gate contact in such a form will not damage the formed structures, and no additional protective layer is needed, thereby simplifying the manufacturing process and reducing the cost of manufacture.

Figure 2B:
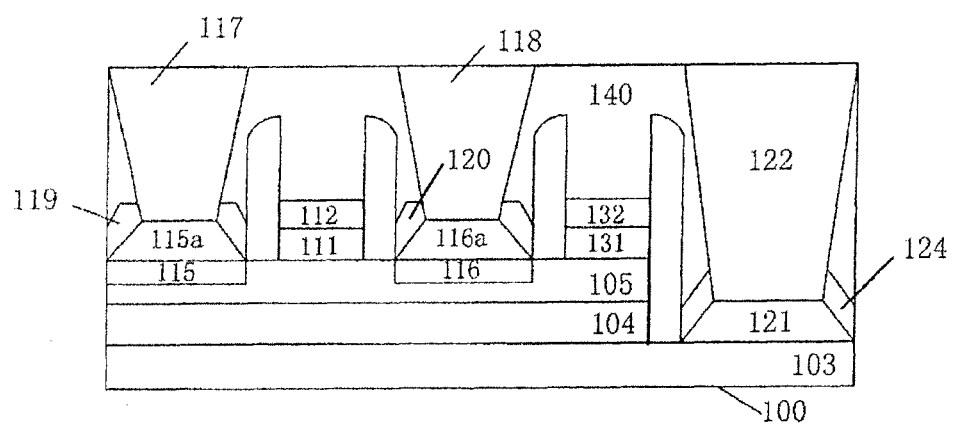
FIG. 2B shows a schematic view of the transistor in FIG. 2A after forming a contact.

FIG. 2B shows a schematic view of the transistor in FIG. 2A after forming a contact.

As shown in FIG. 2B, a source region contact plug 117 and a drain region contact plug 118 may be formed on the raised part 115a of the source region and the raised part 116a of the drain region of the transistor, respectively. In the exemplary embodiment shown in FIG. 2B, the source region contact plug 117 and the drain region contact plug 118 may be formed in a passivation layer 140 above the source region and the drain region, respectively.

Optionally, the raised part 115a of the source region and the raised part 116a of the drain region may comprise a metal silicide, respectively. Optionally, liners 119 and 120 may be formed on the outer surface of the raised part 115a of the source region and the outer surface of the raised part 116a of the drain region, respectively. The liners 119 and 120 may, for example, comprise a nitride.

A back-gate contact plug 122 may further be formed on the back gate contact 121. Optionally, the raised part of the back gate contact 121 may comprise a metal silicide. The metal silicide may, for example, be formed in a portion of the raised part of the back gate contact. Optionally, a liner 124 may further be formed on the outer surface of the raised part of the back gate contact. The liner 124 may, for example, comprise a nitride.

In the following, a method for manufacturing a transistor according to an exemplary embodiment of the invention is described in detail with reference to FIGS. 3A to 3F.

Figure 3A:
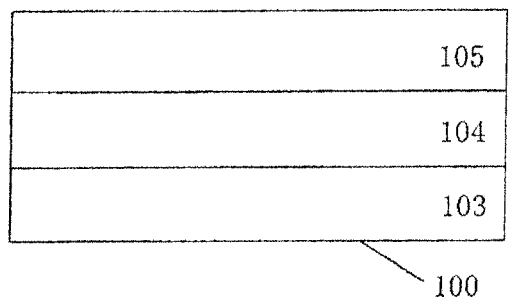
FIG. 3A shows a first step of a method for manufacturing a transistor according to an exemplary embodiment of the invention.

FIG. 3A shows a first step of a method for manufacturing a transistor according to an exemplary embodiment of the invention. In this step, a substrate 100 is provided. The substrate 100 may comprise a back gate 103, an insulating layer 104 and a semiconductor layer 105 stacked sequentially.

As an example, the insulating layer 104 of the substrate 100 may comprise, but not limited to, a material selected from a group consisting of $SiO_2$, $Si_3N_4$, and a combination thereof. The semiconductor layer 105 may comprise, but not limited to, a material selected from a group consisting of Si, SiGe, SiC, Ge, GaAs, InP, and combinations thereof.

The back gate 103 may comprise, for example, a semiconductor material. For example, the back gate 103 may comprise, but not limited to, a material selected from a group consisting of Si, SiGe, SiC, Ge, GaAs, InP, and combinations thereof. The back gate 103 may also comprise metals. For example, the back gate 103 may comprise, but not limited to, a material selected from a group consisting of Cu, Al, TiN, and combinations thereof. The back gate 103 may be used for adjusting the threshold voltage of the transistor.

It should be noted that the number of the semiconductor layer and the number of the insulating layer comprised in the substrate 100 are not limited to those shown in FIG. 3A. The substrate may comprise, for example, more semiconductor layers or insulating layers.

Figure 3B:
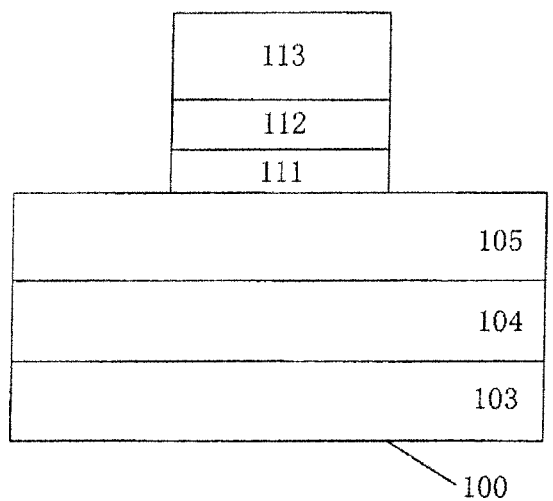
FIG. 3B shows a second step of the method for manufacturing the transistor according to the exemplary embodiment of the invention.

FIG. 3B shows a second step of the method for manufacturing the transistor according to the exemplary embodiment of the invention. As shown in FIG. 3B, a gate stack is formed on the semiconductor layer 105. The gate stack may comprise a gate dielectric 111, a gate electrode 112 formed on the gate dielectric, and a sacrificial layer 113 formed on the gate electrode. The gate dielectric may, for example, comprise a material selected from a group consisting of $SiO_2$, $Si_3N_4$, $HfO_2$, and combinations thereof. The gate electrode may, for example, comprise a material selected from a group consisting of Ti, Al, Cu, graphene, and combinations thereof. The sacrificial layer 113 may comprise a dielectric. For example, the sacrificial layer may comprise a material selected from a group consisting of $Si_3N_4$, $SiO_2$, high-K dielectric, etc, or any combination thereof. The sacrificial layer 113 may also comprise a semiconductor material, e.g., polysilicon.

In an example, the gate stack may be formed by depositing a dielectric layer, an electrode layer and a sacrificial layer on the semiconductor layer 105 of the substrate 100 sequentially, and then patterning the deposited sacrificial layer, electrode layer and dielectric layer. However, the invention is not limited to this. The gate stack may also be formed by other methods known to those skilled in the art.

Figure 3C:
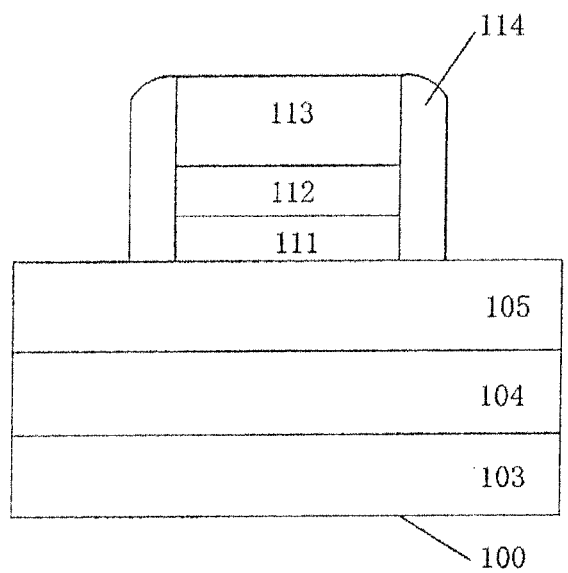
FIG. 3C shows a third step of the method for manufacturing the transistor according to the exemplary embodiment of the invention.

FIG. 3C shows a third step of the method for manufacturing the transistor according to the exemplary embodiment of the invention. As shown in FIG. 3C, a spacer 114 is formed on sidewalls of the gate stack comprising the gate dielectric 111, the gate electrode 112 and the sacrificial layer 113. The spacer 114 may comprise a nitride, such as $Si_3N_4$. The spacer 114 may also comprise an oxide, such as $SiO_2$.

Figure 3D:
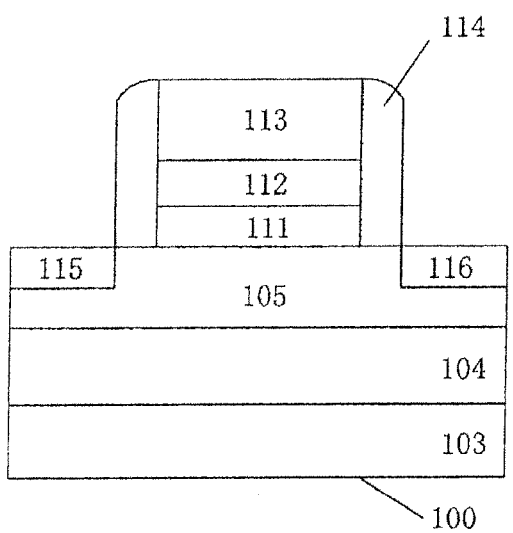
FIG. 3D shows a fourth step of the method for manufacturing the transistor according to the exemplary embodiment of the invention.

FIG. 3D shows a fourth step of the method for manufacturing the transistor according to the exemplary embodiment of the invention. In this step, a source region 115 and a drain region 116 are formed on both sides of the gate stack, respectively.

In an example, the source region 115 and the drain region 116 may be formed by implanting ions into the semiconductor layer 105 on both sides of the gate stack. For an N-channel transistor, such as an NFET, the ions implanted may, for example, be arsenic or phosphor, and for a P-channel transistor, such as a PFET, the ions implanted may, for example, be boron. However, the invention is not limited to this. The source region 115 and the drain region 116 may also be formed by other methods known to those skilled in the art.

Figure 3E:
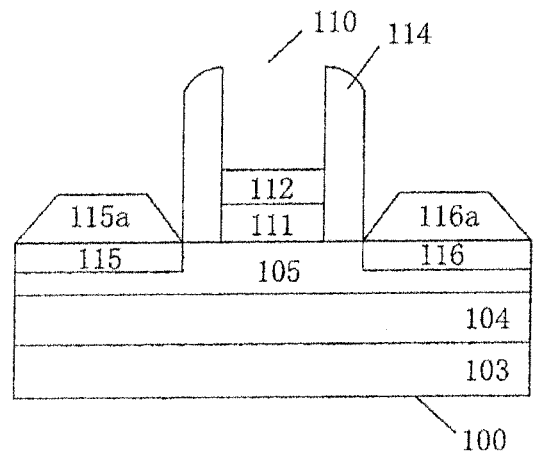
FIG. 3E shows a fifth step of the method for manufacturing the transistor according to the exemplary embodiment of the invention.

FIG. 3E shows a fifth step of the method for manufacturing the transistor according to the exemplary embodiment of the invention. In this step, the sacrificial layer 113 of the gate stack is selectively removed. The height of the gate stack may be reduced in this step. As shown in FIG. 3E, the height of the gate stack comprising the gate dielectric 111 and the gate electrode 112 is lower than the height of the spacer 114. After the step shown in FIG. 3E is performed, the height of the gate stack may be within the range of about 0.5 nm to 30 nm, for example.

In an example, the sacrificial layer 113 of the gate stack may be selectively removed by etching. However, the invention is not limited to this. The sacrificial layer may also be selectively removed by other methods known to those skilled in the art.

Optionally, before the step of selectively removing the sacrificial layer, selective growth may be performed to the source region 115 and the drain region 116, such that the source region 115 and the drain region 116 comprise parts 115a and 116a raised from the surface of the semiconductor layer 105, respectively. The source region and the drain region of the transistor are raised.

In an example, the raised parts 115a and 116a may be formed by a selective epitaxy. However, the invention is not limited to this. The step of selective growth may also be performed by other methods known to those skilled in the art.

A transistor according to the exemplary embodiment of the invention is formed by the manufacturing method shown in FIGS. 3A to 3E. In the transistor, the back gate is used for adjusting the threshold voltage of the transistor, and the height of the gate stack is reduced by using a sacrificial layer. Such a gate stack with a reduced height can reduce the parasitic capacitance and thus improve the performance of the transistor.

In the existing process flow for manufacturing a transistor, there is a limitation to the height of the gate stack in some circumstances. For example, in a process for forming the source region and the drain region, it may be desirable for the formed gate stack to serve as a self-aligned barrier layer such that the gate stack is required to have a certain height, which limits the reduction of the height of the gate stack. In a method for manufacturing a transistor according to an exemplary embodiment of the invention, the formed gate stack comprises a sacrificial layer. The gate stack comprising a sacrificial layer has a certain height, and thus can serve as a self-aligned barrier layer in a process for forming the source region and the drain region, for example. The subsequent removal of the sacrificial layer enables the height of the gate stack to be reduced. By reducing the height of the gate stack, the performance of the transistor may be improved, and the process tolerance may be increased, such that further optimization may be achieved by the designer of the device.

Figure 3F:
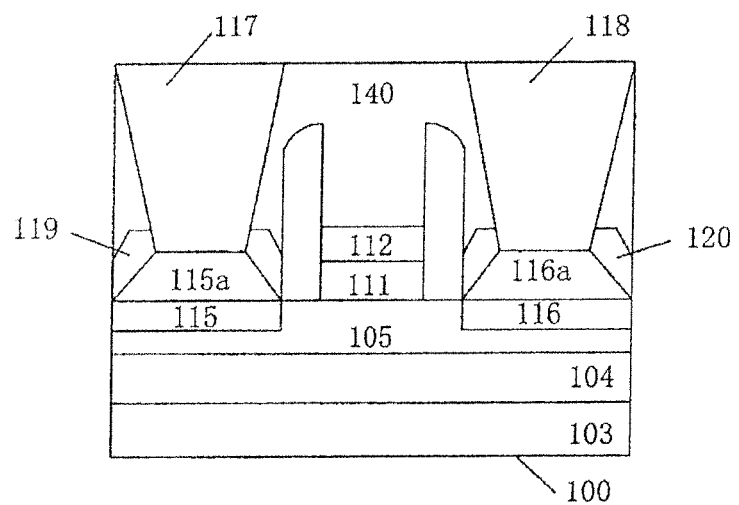
FIG. 3F shows an optional sixth step of the method for manufacturing the transistor according to the exemplary embodiment of the invention.

Optionally, the method for manufacturing the transistor according to the exemplary embodiment of the invention may further comprise a step shown in FIG. 3F. In this step, a source region contact plug 117 and a drain region contact plug 118 are formed on the raised part 115a of the source region and on the raised part 116a of the drain region of the transistor, respectively. In an example, the source region contact plug 117 and the drain region contact plug 118 may be formed in a passivation layer 140 above the source region and the drain region, respectively. The source region contact plug 117 and the drain region contact plug 118 may, for example, comprise metals. For example, the source region contact plug 117 and the drain region contact plug 118 may comprise tungsten or copper, etc.

Optionally, before forming the source region contact plug 117 and the drain region contact plug 118, a metal silicide may be formed in the raised part 115a of the source region and in the raised part 116a of the drain region, respectively. Furthermore, optionally, liners 119 and 120 may further be formed on the outer surface of the raised part 115a of the source region and on the outer surface of the raised part 116a of the drain region, respectively. The liners 119 and 120 may comprise a nitride, for example.

In an example, the source region contact plug and the drain region contact plug may be formed in the following manner. Firstly, a metal silicide is formed in the raised part of the source region and in the raised part of the drain region, respectively. Then, a liner formed by nitride, for example, is deposited on the outer surface of the raised part of the source region and on the outer surface of the raised part of the drain region. Afterwards, a low-temperature thermal oxidation (LTO) is performed at a temperature in the range of about 0-500° C. to form a passivation layer. Subsequently, the formed passivation layer is planarized by a planarization process like chemical mechanical polishing (CMP). Then, a contact hole is formed at the position where a contact plug is to be formed in the planarized passivation layer. Finally, the contact hole is filled with a plug material, for example, tungsten, thereby forming the source region contact plug and the drain region contact plug. It should be noted that the invention is not limited to the above example. The source region contact plug and the drain region contact plug may also be formed by other methods known to those skilled in the art.

In the following, a method for manufacturing a transistor according to another exemplary embodiment of the invention is described in detail with reference to FIGS. 4A to 4F.

Figure 4A:
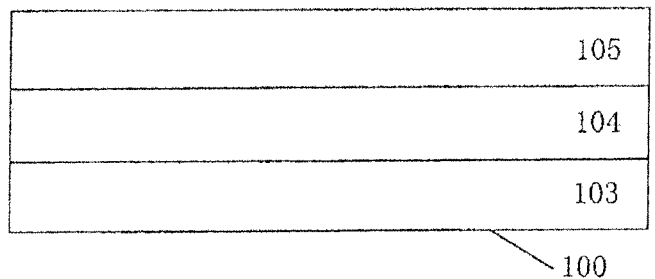
FIG. 4A shows a first step of a method for manufacturing a transistor according to another exemplary embodiment of the invention.

FIG. 4A shows a first step of a method for manufacturing a transistor according to another exemplary embodiment of the invention. In this step, a substrate 100 is provided. The substrate 100 may comprise a back gate 103, an insulating layer 104 and a semiconductor layer 105 stacked sequentially.

As an example, the insulating layer 104 of the substrate 100 may comprise, but not limited to, a material selected from a group consisting of $SiO_2$, $Si_3N_4$, and a combination thereof. The semiconductor layer 105 may comprise, but not limited to, a material selected from a group consisting of Si, SiGe, SiC, Ge, GaAs, InP, and combinations thereof.

The back gate 103 may comprise, for example, a semiconductor material. For example, the back gate 103 may comprise, but not limited to, a material selected from a group consisting of Si, SiGe, SiC, Ge, GaAs, InP, and combinations thereof. The back gate 103 may also comprise metals. For example, the back gate 103 may comprise, but not limited to, a material selected from a group consisting of Cu, Al, TiN, and combinations thereof. The back gate 103 may be used for adjusting the threshold voltage of the transistor.

It should be noted that the number of the semiconductor layer and the number of the insulating layer comprised in the substrate 100 are not limited to those shown in FIG. 4A. The substrate may comprise, for example, more semiconductor layers or insulating layers.

Figure 4B:
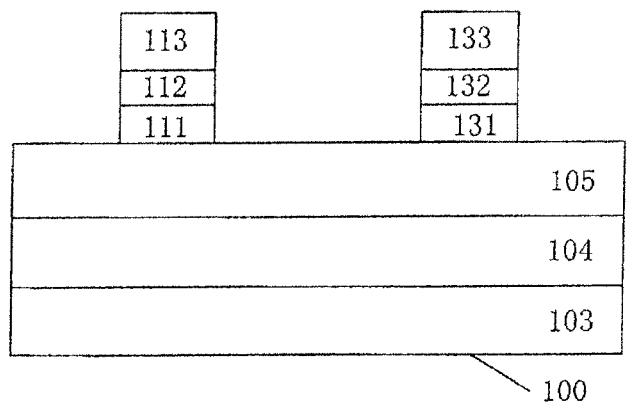
FIG. 4B shows a second step of the method for manufacturing the transistor according to another exemplary embodiment of the invention.

FIG. 4B shows a second step of the method for manufacturing the transistor according to another exemplary embodiment of the invention. As shown in FIG. 4B, a gate stack is formed on the semiconductor layer 105. The gate stack may comprise a gate dielectric 111, a gate electrode 112 formed on the gate dielectric, and a sacrificial layer 113 formed on the gate electrode.

Optionally, a dummy gate stack may further be formed on the semiconductor layer 105 in this step. The dummy gate stack may, for example, comprise a dummy gate dielectric 131, a dummy gate electrode 132 formed on the dummy gate dielectric, and a sacrificial layer 133 formed on the dummy gate electrode. Forming a dummy gate stack at the same time when forming a gate stack may simplify the process of isolating the back gate contact from the source region and the drain region of the transistor by forming a dielectric structure of shallow trench isolation, for example.

The gate dielectric and the dummy gate dielectric may, for example, comprise a material selected from a group consisting of $SiO_2$, $Si_3N_4$, $HfO_2$, and combinations thereof. The gate electrode and the dummy gate electrode may, for example, comprise a material selected from a group consisting of Ti, Al, Cu, graphene, and combinations thereof. The sacrificial layer may, for example, comprise a dielectric material. For example, the sacrificial layer may comprise a material selected from a group consisting of $Si_3N_4$, $SiO_2$, high-K dielectric, etc., or any combination thereof. The sacrificial layer may also comprise a semiconductor material, e.g., polysilicon.

In an example, the gate stack and the dummy gate stack may be formed by depositing a dielectric layer, an electrode layer and a sacrificial layer on the semiconductor layer 105 of the substrate 100 sequentially, and then patterning the deposited sacrificial layer, electrode layer and dielectric layer. However, the invention is not limited to this. The gate stack and the dummy gate stack may also be formed by other methods known to those skilled in the art.

Figure 4C:
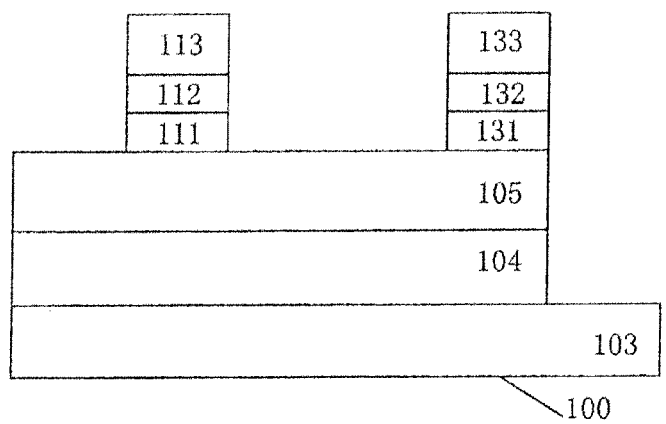
FIG. 4C shows a third step of the method for manufacturing the transistor according to another exemplary embodiment of the invention.

FIG. 4C shows a third step of the method for manufacturing the transistor according to another exemplary embodiment of the invention. As shown in FIG. 4C, a portion of the semiconductor layer 105 and a portion of the insulating layer 104 are selectively removed to expose a portion of the back gate 103. As will be described in the following, in a subsequent step, a back gate contact will be formed on the exposed portion of the back gate 103.

In an example, a portion of the semiconductor layer 105 and a portion of the insulating layer 104 may be selectively removed by etching. For example, a portion of the back gate may be exposed by masking the portion of the semiconductor layer 105 and the insulating layer 104 that need not be removed using a mask, performing an exposure process, and then etching the exposed portion. However, the invention is not limited to this. A portion of the semiconductor layer 105 and a portion of the insulating layer 104 may be selectively removed by other methods known to those skilled in the art.

Figure 4D:
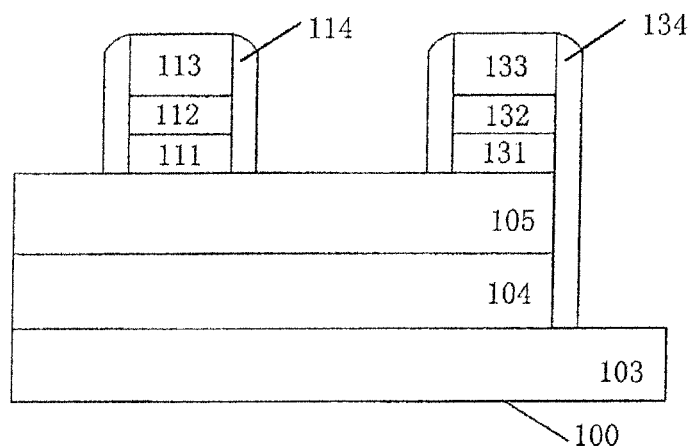
FIG. 4D shows a fourth step of the method for manufacturing the transistor according to another exemplary embodiment of the invention.

FIG. 4D shows a fourth step of the method for manufacturing the transistor according to another exemplary embodiment of the invention. As shown in FIG. 4D, a spacer 114 is formed on sidewalls of the gate stack comprising the gate dielectric 111, the gate electrode 112 and the sacrificial layer 113. The spacer 114 may comprise a nitride, such as $Si_3N_4$. The spacer 114 may also comprise an oxide, such as $SiO_2$.

In an example where a dummy gate stack is formed on the semiconductor layer 105, a spacer 134 may further be formed on sidewalls of the dummy gate stack at the same time when forming the spacer 114.

Figure 4E:
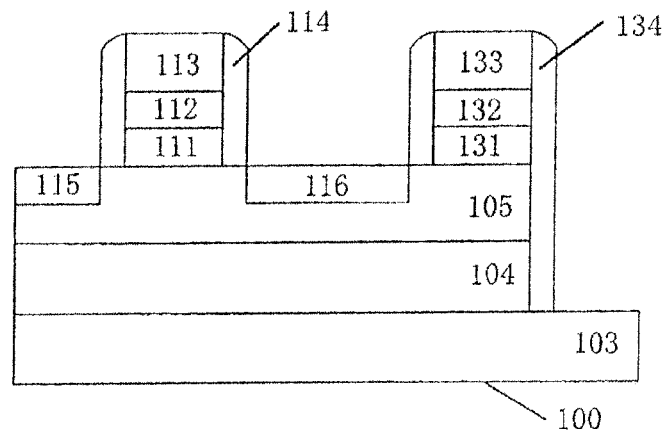
FIG. 4E shows a fifth step of the method for manufacturing the transistor according to another exemplary embodiment of the invention.

FIG. 4E shows a fifth step of the method for manufacturing the transistor according to another exemplary embodiment of the invention. In this step, a source region 115 and a drain region 116 are formed on both sides of the gate stack, respectively.

In an example, the source region 115 and the drain region 116 may be formed by implanting ions into the semiconductor layer 105 on both sides of the gate stack. For an N-channel transistor, such as an NFET, the ions implanted may, for example, be arsenic or phosphor, and for a P-channel transistor, such as a PFET, the ions implanted may, for example, be boron. However, the invention is not limited to this. The source region 115 and the drain region 116 may also be formed by other methods known to those skilled in the art.

Figure 4F:
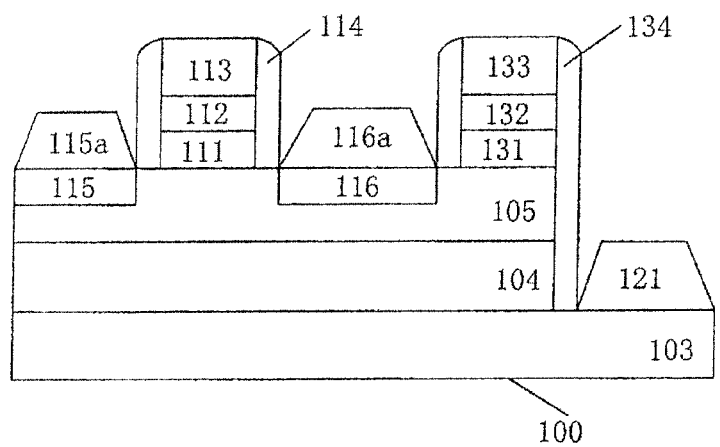
FIG. 4F shows a sixth step of the method for manufacturing the transistor according to another exemplary embodiment of the invention.

FIG. 4F shows a sixth step of the method for manufacturing the transistor according to another exemplary embodiment of the invention. In this step, selective growth is performed to the exposed portion of the back gate 103, the source region 115 and the drain region 116 to form a part raised from the surface of the back gate and thus form a back gate contact 121, such that each of the source region 115 and the drain region 116 comprises respective parts 115a and 116a raised from the surface of the semiconductor layer 105. In other words, the source region, the drain region, and the exposed portion of the back gate of the transistor are raised by the selective growth.

In an example, the raised parts 115a and 116a of the source region 115 and the drain region 116 may be formed by a selective epitaxy. However, the invention is not limited to this. The step of selective growth may also be performed by other methods known to those skilled in the art.

By forming a back gate contact 121 on a portion of the back gate 103, a desired electric connection between the back gate of the transistor and other components in the circuit may be implemented. Moreover, in the manufacturing method described above, the formation of the back gate contact will not damage the formed structures (e.g. the buried insulating layer in the substrate), and no additional protective layer is needed. This simplifies the manufacturing process and reduces the cost of manufacture.

Figure 4G:
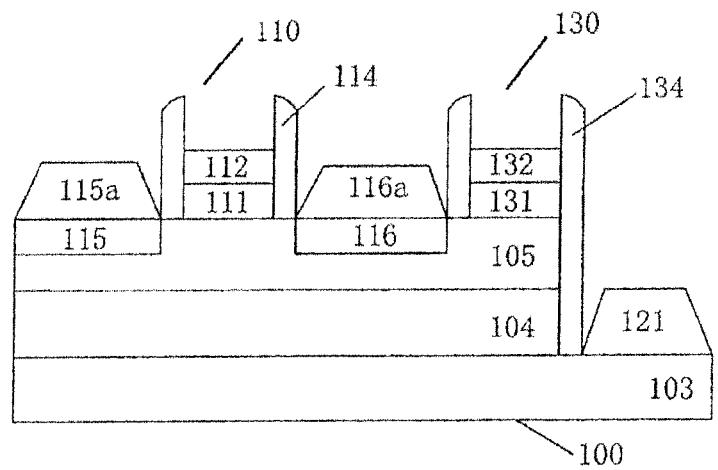
FIG. 4G shows a seventh step of the method for manufacturing the transistor according to another exemplary embodiment of the invention.

FIG. 4G shows a seventh step of the method for manufacturing the transistor according to another exemplary embodiment of the invention. In this step, the sacrificial layer 113 of the gate stack is selectively removed. The height of the gate stack may be reduced by this step. As shown in FIG. 4G, the height of the gate stack comprising the gate dielectric 111 and the gate electrode 112 is lower than the height of the spacer 114. After the step shown in FIG. 4G is performed, the height of the gate stack may be within the range of about 0.5 nm to 30 nm, for example.

In an example, the sacrificial layer 113 of the gate stack may be selectively removed by etching. However, the invention is not limited to this. The sacrificial layer may also be selectively removed by other methods known to those skilled in the art.

In an example where a dummy gate stack is formed on the semiconductor layer 105, the sacrificial layer 133 of the dummy gate stack may also be removed at the same time in this step.

Figure 4H:
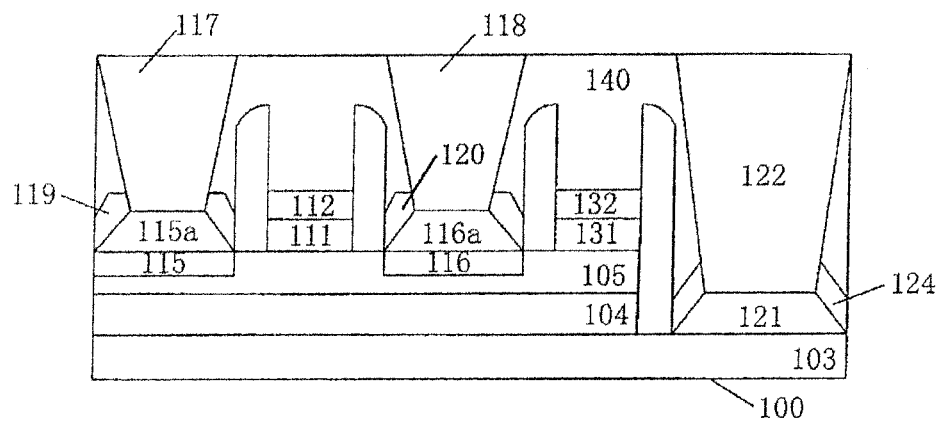
FIG. 4H shows an optional eighth step of the method for manufacturing the transistor according to another exemplary embodiment of the invention.

Optionally, the method for manufacturing the transistor according to another exemplary embodiment of the invention may further comprise a step shown in FIG. 4H. In this step, a source region contact plug 117 and a drain region contact plug 118 are formed on the raised part 115a of the source region and on the raised part 116a of the drain region of the transistor, respectively. In an example, the source region contact plug 117 and the drain region contact plug 118 may be formed in a passivation layer 140 above the source region and the drain region, respectively. The source region contact plug 117 and the drain region contact plug 118 may, for example, comprise metals. For example, the source region contact plug 117 and the drain region contact plug 118 may comprise tungsten or copper, etc.

Optionally, before forming the source region contact plug 117 and the drain region contact plug 118, a metal silicide may be formed in the raised part 115a of the source region and in the raised part 116a of the drain region, respectively. Furthermore, optionally, liners 119 and 120 may further be formed on the outer surface of the raised part 115a of the source region and on the outer surface of the raised part 116a of the drain region, respectively. The liners 119 and 120 may comprise a nitride, for example.

Optionally, in the step shown in FIG. 4H, a back-gate contact plug 122 may further be formed on the back gate contact 121. The back-gate contact plug 122 may, for example, comprise metals. For example, the back-gate contact plug may comprise tungsten or copper, etc.

Optionally, before forming a back-gate contact plug 122, a metal silicide may be formed in the raised part of the back gate contact. Furthermore, optionally, a liner 124 may further be formed on the outer surface of the raised part of the back gate contact. The liner 124 may, for example, comprise a nitride.

In an example, the back-gate contact plug as well as the source region contact plug and the drain region contact plug may be formed in the following manner. Firstly, a metal silicide is formed in the raised part of the back gate contact, the raised part of the source region and the raised part of the drain region, respectively. Then, a liner formed by nitride, for example, is deposited on the outer surface of the raised part of the back gate contact, the outer surface of the raised part of the source region and the outer surface of the raised part of the drain region. Afterwards, a low-temperature thermal oxidation (LTO) is performed, for example, at a temperature in the range of about 0-500° C. to form a passivation layer. Subsequently, the formed passivation layer is planarized by a planarization process like chemical mechanical polishing (CMP). After that, a contact hole is formed at the position where a contact plug is to be formed in the planarized passivation layer. Finally, the contact hole is filled with a plug material, for example, tungsten, thereby forming the back-gate contact plug as well as the source region contact plug and the drain region contact plug. It should be noted that the invention is not limited to the above example. The back-gate contact plug as well as the source region contact plug and the drain region contact plug may also be formed by other methods known to those skilled in the art.

While the exemplary embodiments of the invention have been described in detail with reference to the drawings, such a description should be considered illustrative or exemplary rather than restrictive. The invention is not limited to the disclosed embodiments. Various embodiments described in the above and the claims may also be combined. Variations to the disclosed embodiments can be understood and effected by those skilled in the art in practicing the claimed invention from a study of the drawings, the disclosure, and the appended claims, which variations also fall into the protective scope of the invention.

In the claims, the word "comprising" does not exclude the presence of other elements or steps, and the indefinite article "a" or "an" does not exclude a plurality of elements. The mere fact that certain means are recited in mutually different dependent claims does not indicate that any combination of these means cannot be used advantageously.

The invention claimed is:

1. A transistor comprising:
   a substrate comprising at least a back gate of the transistor, an insulating layer and a semiconductor layer stacked sequentially, wherein the back gate of the transistor is used for adjusting the threshold voltage of the transistor;
   a gate stack formed on the semiconductor layer, wherein the gate stack comprises a gate dielectric and a gate electrode formed on the gate dielectric;
   a spacer formed on sidewalls of the gate stack;
   a source region and a drain region located on both sides of the gate stack, respectively; and
   a back gate contact formed on a portion of the back gate, wherein the back gate contact comprises a part raised from the surface of the back gate, and each of the source region and the drain region comprises a part raised from the surface of the semiconductor layer, and
   a height of the gate stack is lower than a height of the spacer, wherein the back gate contact is isolated from the source region and the drain region by a dummy gate.

2. The transistor according to claim 1, wherein the dummy gate comprises a dummy gate stack, and a spacer is formed on sidewalls of the dummy gate stack.

3. The transistor according to claim 1, wherein a back-gate contact plug is formed on the back gate contact.

4. The transistor according to claim 1, wherein a source region contact plug and a drain region contact plug are formed on the raised part of the source region and on the raised part of the drain region, respectively.

* * * * *